United States Patent
Engl et al.

(10) Patent No.: US 6,621,431 B2
(45) Date of Patent: Sep. 16, 2003

(54) ANALOG-TO-DIGITAL CONVERTER CIRCUIT

(75) Inventors: Bernhard Engl, Miesbach (DE); Andreas Menkhoff, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/217,009

(22) Filed: Aug. 12, 2002

(65) Prior Publication Data

US 2003/0052803 A1 Mar. 20, 2003

Related U.S. Application Data

(63) Continuation of application No. PCT/EP01/01521, filed on Feb. 12, 2001.

(30) Foreign Application Priority Data

Feb. 18, 2000 (DE) .......................... 100 07 408

(51) Int. Cl.[7] .............................. H03M 1/10; H03M 1/12
(52) U.S. Cl. ........................ 341/120; 341/155
(58) Field of Search ......................... 341/155, 120, 341/118, 119, 156, 131

(56) References Cited

U.S. PATENT DOCUMENTS

| | | | |
|---|---|---|---|
| 4,947,168 A | 8/1990 | Myers | |
| 4,999,627 A * | 3/1991 | Agazzi | 341/131 |
| 5,266,951 A * | 11/1993 | Kuegler et al. | 341/120 |
| 5,361,067 A | 11/1994 | Pinckley | |
| 5,500,644 A | 3/1996 | Denjean et al. | |
| 6,081,214 A | 6/2000 | Morisson et al. | |
| 6,084,539 A * | 7/2000 | Yamada | 341/155 |
| 6,175,323 B1 * | 1/2001 | Flynn | 341/156 |
| 6,473,012 B2 * | 10/2002 | Hellberg et al. | 341/120 |

FOREIGN PATENT DOCUMENTS

| | | |
|---|---|---|
| DE | 195 31 818 C1 | 10/1996 |
| EP | 0 866 561 A1 | 9/1998 |
| FR | 2 697 955 A1 | 5/1994 |

OTHER PUBLICATIONS

Moon, Un–Ku, et al.; "Background Digital Calibration Techniques for Pipelined ADC's;" IEEE 1997, vol. 44, No. 2, pp. 102–109.

Kwak, Sung–Ung, et al.; "A 15–b, 5–Msample/s Low–Spurious CMOS ADC;" IEEE 1997, vol. 32, No. 12, pp. 1866–1875.

* cited by examiner

Primary Examiner—Jean Bruner Jeanglaude
(74) Attorney, Agent, or Firm—Marshall, Gerstein & Borun

(57) ABSTRACT

An analog-to-digital converter circuit including an analog-to-digital converter and calibrating circuit, preferably in the form of a digital logic, for the auto-calibration of the analog-to-digital converter. This configuration produces a very high quality analog-to-digital converter with a very low surface area requirement. The calibrating circuit corrects any errors of the analog-to-digital converter outside or inside of the analog-to-digital converter.

19 Claims, 2 Drawing Sheets

ANALOG-TO-DIGITAL CONVERTER CIRCUIT

RELATED APPLICATIONS

This is a continuation of International Application Serial No. PCT/EP01/01521, with an international filing date of Feb. 12, 2001, published in German under PCT Article 21(2).

BACKGROUND

The present invention relates to an analog-to-digital converter circuit arrangement and, more particularly, an analog-to-digital having control for calibration.

Analog-to-digital converters (A/D converters) serve to convert an analog input signal into a digital output signal. The analog input signal is time and amplitude continuous, while the digital output signal is time and amplitude discrete. Up until the present, A/D converters have been conceived as so-called "stand alone systems." Any subsequent signal processing took place independently of the A/D converter.

A/D converters are designed in the form of highly integrated circuits. While digital structures can be easily reduced in size ("shrunk"), high integration makes reduction in the surface area of analog structures more and more difficult or even impossible. In addition, a reduction in the operating voltage is associated with increased high integration of the A/D converters. As a result of the increasing reduction in operating voltages, it becomes more and more difficult to ensure good analog quality.

SUMMARY

According to an aspect of the disclosed apparatus, an analog-to-digital converter circuit arrangement is provided having an analog-to-digital converter configured to convert an analog input signal (x(t)) into a corresponding digital output signal (y(k)) during a normal operation. A control circuitry is included that is configured to calibrate the analog-to-digital converter during a calibration operation, wherein conversion of the analog input signal (x(t)) into the digital output signal (y(k)) during normal operation is interrupted for the calibration operation. Additionally, a digital interpolation unit is included and configured to obtain and emit a scanning value of the digital output signal (y(k)) corresponding to a momentary analog input signal (x(t)) by interpolating adjacent scanning values of the digital output signal (y(k)) adjacent to the scanning value during the calibration operation. A digital delay circuit is included and configured to compensate a group delay time of the digital interpolation unit and emit the digital output signal during normal operation of the analog-to-digital converter.

DETAILED DESCRIPTION OF THE PREFERRED EXAMPLES

Figure 1:
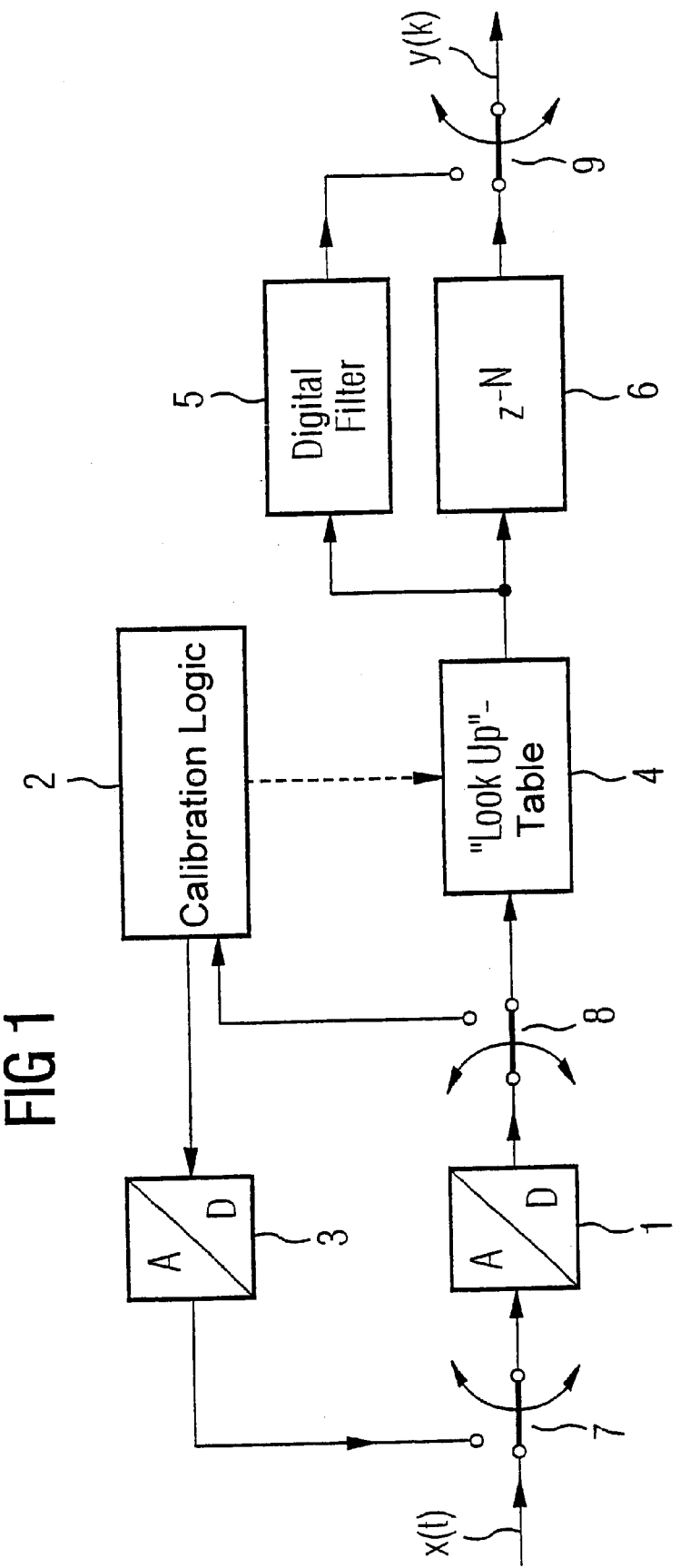
FIG. 1 illustrates a block circuit diagram of an analog-to-digital converter circuit arrangement in accordance with a first example.

In the case of the analog-to-digital converter circuit arrangement shown in FIG. 1 possible errors of the A/D converters are corrected outside the A/D converter. The analog-to-digital converter circuit arrangement, which may be designed in the form of an integrated circuit, includes as a main component an A/D converter 1 that scans a time and amplitude continuous analog input signal x(t) and converts it into a time and amplitude discrete digital output signal y(k). Control circuitry including a digital calibration logic 2 in combination with a D/A converter 3 and a digital correction unit 4 is provided to calibrate the A/D converter 1. Controllable switches 7, 8 and 9 are used to switch between normal operation and calibration operation.

During normal operation the controllable switches 7, 8 and 9 are in the position shown in FIG. 1. The A/D converter 1 therefore scans the analog input signal x(t) and converts the individual analog scanning values into corresponding digital values. The digital output signal resulting from this is emitted via the digital correction unit 4 and a digital delay circuit 6 of the order N. The digital delay circuit 6 serves to compensate the group delay time of a digital filter 5 serving as a digital interpolation unit. The digital correction unit 4 is, for example, provided in the form of a RAM memory device, where a so-called "Look Up" table is stored. The "Look Up" table includes various correction values, with which the individual digital scanning values of the A/D converter 1 are corrected. The digital calibration logic 2 defines the content of the digital correction unit 4 (hereinafter referred to as "'Look Up' table 4") during the calibration operation described below.

For calibration, the digital calibration logic 2 changes the controllable switches 7, 8 and 9 so that the input of the A/D converter 1 is connected to the output of the D/A converter 3 and the output of the A/D converter 1 is connected to the digital calibration logic 2. The switch 9 is, however, connected only a few cycles later to the output of a digital filter 5 in order to emit an interpolation value again described in more detail below. During the calibration operation the digital calibration logic 2 feeds the A/D converter 1 via the D/A converter 3 with a predefined analog input level and evaluates the digital output level of the A/D converter 1 being adjusted, accordingly. In the error-free case, the digital output level of the A/D converter 1 should correspond to a preset analog input level. If, however, the digital calibration logic 2 finds a deviation, this deviation is used to calibrate the A/D converter 1, as a result of the digital calibration logic 2 storing a corresponding correction value in "Look Up" table 4 for the output value of the A/D converter 1 measured. The analog input signal x(t) is only interrupted for a brief moment during the calibration operation. During this interruption, the digital calibration logic 2 can either specify a single input level or several input levels one after the other for the A/D converter 1, wherein several correction values for the "Look Up" table 4 can be obtained during interruption of the analog input signal x(t) in the latter case.

Since the analog input signal x(t) is interrupted for the duration of each calibration operation, one scanning value for the digital output signal y(k) is missing during this time span. This missing scanning value can be obtained through interpolation from the adjacent scanning values, the digital filter 5 already mentioned being provided for this purpose. If the bandwidth of the input signal is less than a quarter of the scanning frequency, the interpolation can be carried out almost perfectly, since interpolation errors can always be kept smaller with corresponding circuit complexity than the quantization error of the input signal. If, on the other hand, the bandwidth of the input signal is greater than a quarter of the scanning frequency, although interpolation takes place with a lower error, this error is more than compensated by the higher resolution of the A/D converter 1 after calibration.

The A/D converter 1 is preferably calibrated periodically during each M-th scanning value of the analog input signal x(t). After calibration has been carried out, the switches 7 and 8 are again changed in the position shown in FIG. 1, so that normal A/D conversion of the analog input signal x(t) can take place again. The switch 9 is only connected to the digital filter 5 for the duration of a scanning value period in order to emit the interpolation value for the missing scanning value of the digital output signal y(k) supplied by the digital filter 5.

With many A/D converter types the error of the A/D converter can be traced back to offset errors of the component parts forming the particular A/D converter. In the case of so-called folding A/D converters, the error of the folding A/D converter, for example, is frequently caused by offset errors of the preamplifier used in the particular folding A/D converter. If these offset errors are successfully reduced by appropriate means or even completely compensated, an almost ideal folding A/D converter is obtained, even though offset errors in the stages of the folding A/D converter following the preamplifiers are not compensated.

Folding A/D converters in comparison to other A/D converter types, e.g., flash A/D converters, require considerably less circuit complexity. A flash A/D converter monitors each threshold value with a separate comparator or amplifier, so that an n-bit flash A/D converter requires a total of $2^N-1$ comparators or amplifiers. A folding A/D converter on the other hand subdivides ("folds") the level range of the analog input signal into m parts and for each part carries out an n-bit flash quantization with $n=N-\log_2(m)$. While for a 4-bit flash A/D converter a total of 15 comparators are required, a 4-bit folding A/D converter only requires a total of six comparators.

Figure 2:
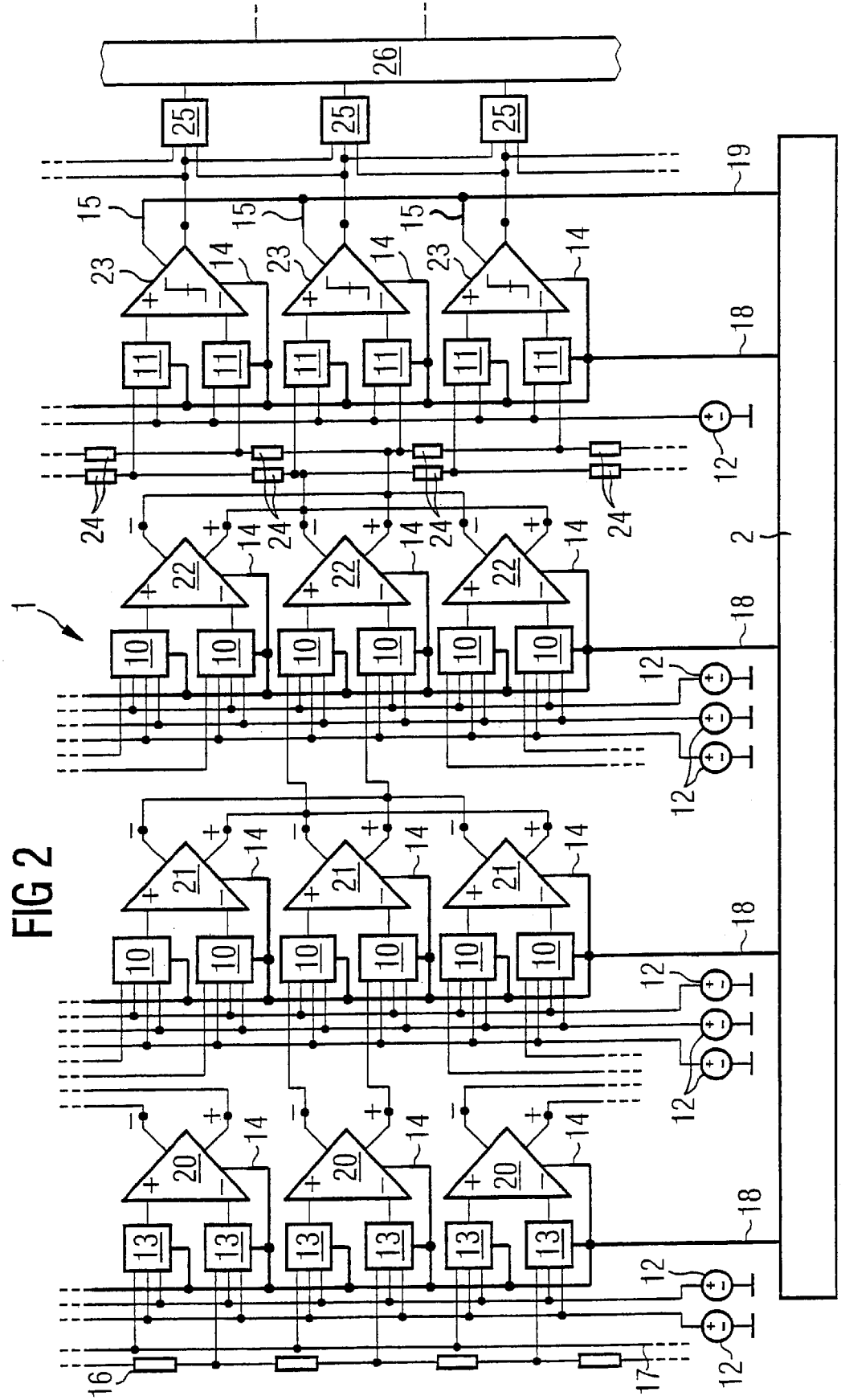
FIG. 2 illustrates a block circuit diagram of an analog-to-digital converter circuit arrangement in accordance with a second example.

In FIG. 2 a section of a folding A/D converter is shown, in which calibration is carried out by means existing inside the converter. This concerns a folding A/D converter with cascaded folding amplifiers or folding stages 21, 22, which are driven by preamplifiers 20. The output of the second folding stage 22 leads via an interpolation network 24 to comparators 23, which are topped by thermometer code-correction gates 25 and an encoder 26. The parts described up until now correspond to the state of the art and their method of working is known to the person skilled in the art.

Additional means provided for internal auto-calibration of the converter shown in FIG. 2 operate in the following way. Multiplexers 10, 11 and 13, which are in each case driven via a control bus 18, enable the inputs of the amplifiers 20–22 or more precisely comparators 23 to be changed in this way and supported with auxiliary potentials 12 so that clear signal paths result inside the converter. The output signals of these signal paths are fed via outputs 15 of the comparators 23 to a bus 19 delivered by a digital calibration logic or calibration unit 2, which compares the values of these output signals with preset ideal values and, irrespective of the comparison results, adjusts the circuit stages 20–23 found in the individual signal paths via the control buses 18 and adjustment inputs 14 in such a way that a minimum deviation occurs between the actual values measured of the output signals of the individual signal paths and the preset ideal values, i.e., the minimum offset.

The offset compensation described above may also be implemented by connecting the inputs of the component parts 20–23 to be compensated with each other via the multiplexers 10, 11 and 13 such that a zero-voltage input signal is fed to this component part. The output signal of the comparators 23 resulting from this is monitored by the calibration logic 2 and should, in the offset-free case, have a zero crossing or, more precisely, no voltage. If, however, the calibration logic 2 in this case detects a voltage different from zero on the output of the A/D converter 1, the calibration logic 2 acts accordingly upon the particular component parts 20–23 in order to minimize the offset found.

Further, the calibration logic 2 to compensate the offset via a suitable actuator can work upon the particular amplifier 20–22 or comparator 23. For example a D/A converter can be used as the actuator, the output of which acts upon the corresponding amplifier or comparator.

The correction signals of the calibration logic 2 obtained in this way for the individual amplifiers 20–22 and comparators 23 are preferably stored so that the corresponding correction or calibration information is available for a longer period and consequently the intervals between the auto-calibration cycles of the A/D converter 1 can be considerably extended. Thus, the correction signals calculated by the calibration logic 2 can, for example, ensue in analog form inside the actuator used in each case or, if a D/A converter is used as the actuator, in digital form in registers.

According to a variant (not shown), the multiplexers 13 can also be replaced by commutators that change over an input 17 of the A/D converter during calibration to a suitable auxiliary potential. If this auxiliary potential is derived from a D/A converter, so-called mismatch errors in the resistances of a reference chain 16 can also be compensated as a result of this error being seen as an offset voltage and, together with the offset voltage of the preamplifiers 20, be eliminated through corresponding driving of their adjustment inputs 14. It is especially advantageous, if through suitable commutation of those amplifiers, which as well as the preamplifier to be calibrated in each case lie in the reference chain, these are operated in such a way that they over-amplify, since then the part of the folding A/D converter following the preamplifiers can be used as comparator for auto-calibration.

As already briefly mentioned above, the previously described principle, in which the correction of possible errors of the A/D converter 1 is made inside the A/D converter 1 itself, can also be used at the inputs of the folding-amplifiers 21 and 22 in order to compensate their offset so that an almost ideal folding A/D converter stage is available for the following calibration of the preamplifiers 20.

Finally, it is noted that analogous to FIG. 1, interpolation is possible to obtain scanning values of the digital output signal missing on account of calibration interruptions for the example shown in FIG. 2. As a result of the interpolation network already described, auto-calibration during normal operation is made possible in the way illustrated, without redundant electronic parts having to be provided inside the A/D converter 1, which during calibration take the place of the electronic parts to be calibrated. In this way the circuit complexity inside the auto-calibrating A/D converter 1 can be considerably reduced and also further disadvantages such as, for example, lower speed due to higher capacitive loads in the signal paths, which in the case of a solution with redundant circuit parts are inevitable, are avoided.

Therefore, with the presently disclosed examples it is possible to produce auto-calibrating high speed converters, but the examples naturally are not limited to folding A/D converters, but in principle can be used for any A/D converter type, such as flash A/D converters, for example. The present examples, therefore, provide an analog-to-digital converter circuit arrangement in which high quality A/D conversion with minimum surface area requirement is ensured.

The disclosed analog-to-digital converter circuit arrangement, apart from the actual A/D converter, includes a calibration circuit, preferably in the form of a digital logic, which is provided for auto-calibration of the A/D converter. The calibration circuit is, in particular, configured in such a way that it feeds a predefined analog input signal level to the A/D converter, evaluates the behavior of the A/D converter being adjusted on the basis of this predefined analog input signal level and, independently of this evaluation, acts upon the A/D converter.

According to an example of the disclosed A/D converter circuit, calibration or, more precisely, correction of possible errors of the A/D converter is made outside the A/D converter, wherein a predefined analog input signal level is fed preferably via a D/A converter to the A/D converter, the digital output signal level of the A/D converter is adjusted and evaluated and, independently of this, the output signal of the A/D converter is corrected. The output signal of the A/D converter can, for example, be corrected by accessing the so-called "Look-Up table".

According to another example of the disclosed A/D converter circuit, calibration, or more precisely, correction of possible errors of the A/D converter is made through corresponding correction inside the A/D converter. The error in the case of many A/D converter types can be traced back to offset errors of analog component parts such as amplifiers used in the A/D converter, in particular. With this insight, it is possible to detect offset errors of these component parts in order to be able finally to reduce or completely compensate these offset errors with the aid of suitable compensation means. This offset compensation in the case of a preamplifier may be implemented by connecting the input of the preamplifier during normal operation of the A/D converter connected with the analog input signal with the second input of the same preamplifier. Then in the offset-free case, a zero crossing should occur at the output of this preamplifier. If, on the other hand, the preamplifier possesses an offset, a signal different from zero will occur at its output. If the calibration circuit detects this, the calibration circuit produces a corresponding correction signal, by means of which it acts upon the particular preamplifier in order to minimize or completely remove the offset. The correction or calibration information corresponding to this correction signal is preferably stored so that it is available over a longer time span and, therefore, the intervals between the auto-calibration cycles can be considerably extended.

Another example previously explained can be applied especially advantageously to amplifiers used in a so-called folding A/D converter. In this case compensation of a possible offset both preamplifiers as well as the circuit stages of the A/D converter following the preamplifiers is possible. This example is also, however, naturally suitable for A/D converters in which no folding process is used, such as, for example, in the case of traditional flash A/D converters.

During calibration of the A/D converter the analog input signal is interrupted for a brief moment. However, so that a continuous digital output signal can be measured at the output of the A/D converter, preferably digital interpolation is carried out, such as through use of a digital filter, for example, with the aid of which the missing scanning value of the digital output signal can be obtained from the adjacent scanning values.

With the aid of the present disclosed apparatus a simple to implement A/D converter is provided, which, having relatively low surface area requirement, has very good quality.

Although certain apparatus in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. An analog-to-digital converter circuit arrangement comprising:
   an analog-to-digital converter configured to convert an analog input signal (x(t)) into a corresponding digital output signal (y(k)) during a normal operation;
   control circuitry configured to calibrate the analog-to-digital converter during a calibration operation, wherein conversion of the analog input signal (x(t)) into the digital output signal (y(k)) during normal operation is interrupted for the calibration operation;
   a digital interpolation unit configured to obtain and emit a scanning value of the digital output signal (y(k)) corresponding to a momentary analog input signal (x(t)) by interpolating adjacent scanning values of the digital output signal (y(k)) adjacent to the scanning value during the calibration operation; and
   a digital delay circuit configured to compensate a group delay time of the digital interpolation unit and emit the digital output signal during normal operation of the analog-to-digital converter.

2. An analog-to-digital converter circuit arrangement according to claim 1, wherein the control circuitry is configured to feed a predefined analog input signal level to the analog-to-digital converter, evaluate behavior of the analog-to-digital converter being calibrated and control the analog-to-digital converter in dependence upon the evaluated behavior.

3. An analog-to-digital converter circuit arrangement according to claim 1, wherein the control circuitry is configured to feed a predefined input signal level to the analog-to-digital converter, evaluate the digital output signal level of the analog-to-digital converter resulting from the predefined input signal level being fed to the analog-to-digital converter and control the analog-to-digital converter in dependence upon the evaluated digital output signal level.

4. An analog-to-digital converter circuit arrangement according to claim 3, wherein the control circuitry includes an output signal correction unit driven by a digital calibration unit to correct the digital output signal (y(k)) of the analog-to-digital converter.

5. An analog-to-digital converter circuit arrangement according to claim 4, wherein the output signal correction unit is configured in the form of a stored table in which corresponding correction values to correct the digital output signal level of the analog-to-digital converter are stored for various digital output signal levels of the analog-to-digital converter being adjusted with regard to the predefined input signal level.

6. An analog-to-digital converter circuit arrangement according to claim 4, further comprising:
   a changeover switch driven by the calibration unit for feeding the digital output signal of the analog-to-digital converter to the output signal correction unit during normal operation and to the digital calibration unit during calibration operation.

7. An analog-to-digital converter circuit arrangement according to claim 4, further comprising:
   a changeover switch driven by the calibration unit for feeding the analog input signal (x(t)) to the analog-todigital converter during normal operation and feed the predefined input signal level from the digital calibration unit to the analog-to-digital converter during calibration operation.

8. An analog-to-digital converter circuit arrangement according to claim 4, wherein the control circuitry includes a digital-to-analog converter via which the digital calibration logic feeds the predefined input signal level to the analog-to-digital converter.

9. An analog-to-digital converter circuit arrangement according to claim 1, wherein the control circuitry is configured for calibrating the analog-to-digital converter by feeding a predefined analog input signal level to at least one component of the analog-to-digital converter, evaluate a resulting output signal level of the at least one component and control the at least one component independent of the evaluation.

10. An analog-to-digital converter circuit arrangement according to claim 9, wherein the at least one component of the analog-to-digital converter is one of a preamplifier and an amplifier participating in the analog-to-digital conversion process.

11. An analog-to-digital converter circuit arrangement according to claim 10, wherein the analog-to-digital converter is configured in the form of a folding analog-to-digital converter.

12. An analog-to-digital converter circuit arrangement according to claim 9, wherein the control circuitry is configured to feed the at least one component of the analog-to-digital converter with the predefined analog input signal level by connecting inputs of the at least one component with each other.

13. An analog-to-digital converter circuit arrangement according to claim 9, further comprising:
a changeover circuit driven by the control circuitry for feeding the analog input signal (x(t)) or an analog output signal of a preceding component, respectively, to the at least one component of the analog-to-digital converter during normal operation and feeding the predefined analog input signal level to the at least one component during calibration operation.

14. An analog-to-digital converter circuit arrangement according to claim 9, wherein the control circuitry is a component part of the analog-to-digital converter.

15. An analog-to-digital converter circuit arrangement according to claim 9, wherein the control circuitry includes a memory device to store calibration information acquired previously for calibrating the analog-to-digital converter.

16. An analog-to-digital converter circuit arrangement according to claim 6, further comprising:
at least one further changeover switch driven by the control circuitry for emitting the output signal of the analog-to-digital converter as the digital output signal (y(k)) during normal operation and emitting the output signal of the digital interpolation unit during calibration operation.

17. An analog-to-digital converter circuit arrangement according to claim 16, wherein the digital interpolation unit comprises a digital filter arrangement.

18. An analog-to-digital converter circuit arrangement according to claim 13, further comprising:
at least one further changeover circuit driven by the control circuitry for emitting the output signal of the analog-to-digital converter as the digital output signal (y(k)) during normal operation and emitting the output signal of the digital interpolation unit during calibration operation.

19. An analog-to-digital converter circuit arrangement according to claim 18, wherein the digital interpolation unit comprises a digital filter arrangement.

* * * * *